United States Patent
Cabral, Jr. et al.

(10) Patent No.: US 7,378,338 B2
(45) Date of Patent: May 27, 2008

(54) METHOD OF FORMING AN INTERCONNECT STRUCTURE DIFFUSION BARRIER WITH HIGH NITROGEN CONTENT

(75) Inventors: Cyril Cabral, Jr., Ossining, NY (US); Steffen K. Kaldor, Fishkill, NY (US); Hyungjun Kim, LaGrangeville, NY (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 11/461,220

(22) Filed: Jul. 31, 2006

(65) Prior Publication Data

US 2006/0264048 A1    Nov. 23, 2006

Related U.S. Application Data

(62) Division of application No. 10/707,117, filed on Nov. 21, 2003, now Pat. No. 7,098,537.

(51) Int. Cl.
*H01L 21/4763* (2006.01)

(52) U.S. Cl. .................. 438/618; 257/E21.59
(58) Field of Classification Search ......... 257/E21.59, 257/E21.575, E21.627, E21.641, E21.579, 257/E23.145; 438/618, 637
See application file for complete search history.

(56) References Cited

U.S. PATENT DOCUMENTS

| | | | |
|---|---|---|---|
| 6,117,769 A | 9/2000 | Nogami et al. | |
| 6,346,745 B1 | 2/2002 | Nogami et al. | |
| 6,429,122 B2 * | 8/2002 | Chooi et al. | 438/637 |
| 6,491,978 B1 | 12/2002 | Kalyanam | |
| 6,498,091 B1 * | 12/2002 | Chen et al. | 438/627 |
| 6,784,096 B2 | 8/2004 | Chen et al. | |
| 2001/0041250 A1 | 11/2001 | Werkhoven et al. | |
| 2002/0030222 A1 | 3/2002 | Agarwal | |
| 2002/0110999 A1 * | 8/2002 | Lu et al. | 438/584 |
| 2003/0032281 A1 | 2/2003 | Werkhoven et al. | |

\* cited by examiner

*Primary Examiner*—Thao P. Le
(74) *Attorney, Agent, or Firm*—Ira D. Blecker

(57) ABSTRACT

In an interconnect structure of an integrated circuit, a diffusion barrier film in a damascene structure is formed of a film having the composition $TaN_x$, where x is greater than 1.2 and with a thickness of 0.5 to 5 nm.

10 Claims, 4 Drawing Sheets

METHOD OF FORMING AN INTERCONNECT STRUCTURE DIFFUSION BARRIER WITH HIGH NITROGEN CONTENT

CROSS REFERENCE OF RELATED APPLICATIONS

The present patent application is related to prior U.S. patent application Ser. No. 10/707,117, entitled "Interconnect Structure Diffusion Barrier With High Nitrogen Content," issued as U.S. Pat. No. 7,098,537.

TECHNICAL FIELD

The field of the invention is that of integrated circuit processing, in particular forming interconnection structures to electrically connect various components on the integrated circuit.

BACKGROUND OF THE INVENTION

Conventional semiconductor devices typically are made up of a semiconductor substrate, normally a monocrystalline silicon with a plurality of dielectric and conductive layers formed on it. An integrated circuit is formed of semiconductor devices connected by a set of spaced-apart conductive lines and associated interconnection lines, such as bus lines, word lines and logic interconnection lines. Such interconnection lines generally constitute a limiting factor in terms of various functional characteristics of the integrated circuit. There exists a need to provide a reliable interconnection structure capable of achieving higher operating speeds, improved signal-to-noise ratio, improved wear characteristics, improved reliability while at the same time reducing the dimensions of the circuit elements to increasingly smaller size.

Most interconnection lines in the past have been made of aluminum or aluminum-based alloys. The performance of a semiconductor device could be improved by forming the interconnection line of a metal having a higher conductivity than aluminum, thereby increasing current handling capability. It is known that copper, copper-based alloys, gold, gold-based alloys, silver and silver-based alloys generally exhibit a higher conductivity than aluminum and aluminum-based alloys, but each has its own drawbacks. One drawback of using copper, for example, is that copper readily diffuses through silicon dioxide, the typical dielectric material employed in the manufacture of semiconductor devices. Moreover, a low cost satisfactory method for etching copper has yet to be developed.

One method of forming copper interconnection lines is by using a "damascene" technique. Damascene is a process which has been employed for centuries in the fabrication of jewelry, and has recently been adapted for application in the semiconductor industry. Damascene basically involves the formation of a trench or a channel in a planarized insulating layer. That opening is filled with a metal to form a channel and any remaining metal material is polished from the surface of the insulating layer. The traditional etch back technique of providing an interconnection structure involves depositing a metal layer, forming a conductive pattern with interwiring spacings, and filling the interwiring spacings with dielectric material. Thus, damascene differs from the traditional etch back technique by forming a pattern of openings in a dielectric layer that are filled in with metal to form a conductive pattern followed by planarization.

In a "dual damascene" technique, in addition to the etched trench or channel (line) in the dielectric, additional holes known as vias are etched at specific locations in the bottom of the trenches. These vias are openings to lower level circuit elements which are buried in the dielectric. In the dual damascene technique, the trench and the via extending down from the trench are filled with conductive metal in a single step. This is a cost saving measure and also can increase both the process yield as well as the qualities of the electrical connections in the circuit.

According to conventional practices, a plurality of conductive layers are formed over a semiconductor substrate, with the uppermost conductive layer joined to a bonding pad for forming an external electrical connection. In a copper interconnection process, conductive layers would be formed by either damascene or dual damascene techniques. The uppermost conductive layer of the integrated circuit which is to be connected to the chip carrier is typically referred to as the wire bonding layer. The wire bonding layer has bonding pads which are used to make external connections by means of electrically conductive wires and external connection electrodes.

The most commonly used materials for the wire bonding layer are aluminum or aluminum-based alloys, such as aluminum with 2% copper. A bonding tool coupled to a bonding machine connects the bonding pads with external connection electrodes using electrically conductive wires. The electrically conductive wires are bonded to the bonding pads by the bonding tool using ultrasonic and thermal energies.

A suitable conductive barrier layer is needed between the copper interconnection lines and both the surrounding dielectric and any other metallic contacts it might make. Such a barrier layer can be conveniently formed by employing a material that is substantially impervious to the diffusion of impurities into the copper interconnection lines and to the diffusion of copper atoms into the dielectric or nearby metal contacts. It is well known that titanium nitride (TiN) is a suitable conductive barrier material for copper. However, in the copper interconnection processes, conventional tantalum nitride (TaN) is the most commonly used conductive barrier material. Besides TaN, tantalum silicon nitride (TaSiN) can also be used as a conductive barrier material for the copper interconnection processes. The use of TiN would require additional deposition chambers because the deposition of TiN and TaN cannot be performed using the same deposition chamber. The need for additional deposition chambers for TiN deposition undesirably increases the cost and process complexity for the production of semiconductor devices.

Conventional TaN used in interconnect applications as a diffusion barrier for Cu has a nitrogen-to-tantalum ratio of slightly under 1.0. It typically contains a nitrogen content by atomic weight of 20%. U.S. Pat. No. 6,117,769 illustrates a barrier layer used to reduce diffusion of Al into Cu formed from TaN having a somewhat higher fraction of N, in the range of 1.0 to 1.2. This corresponds to a range of 30% to 40% by weight. The foregoing composition produces a layer that is said to be satisfactory for limiting Al diffusion at a TaN in a thickness of as low as 50 nm.

SUMMARY OF THE INVENTION

The invention relates to a liner for a back end interconnect that is formed from $TaN_x$ where x is greater than 1.2.

A feature of the invention is the formation of liners having a thickness less than 1 nm.

Another feature of the invention is the formation of liners having a resistivity greater than 1000 micro-Ohm-cm.

Yet another feature of the invention is the development of a liner layer that occupies less than 10% of the via volume for vias formed according to groundrules of less than 90 nm.

DETAILED DESCRIPTION

Figures 1, 2:
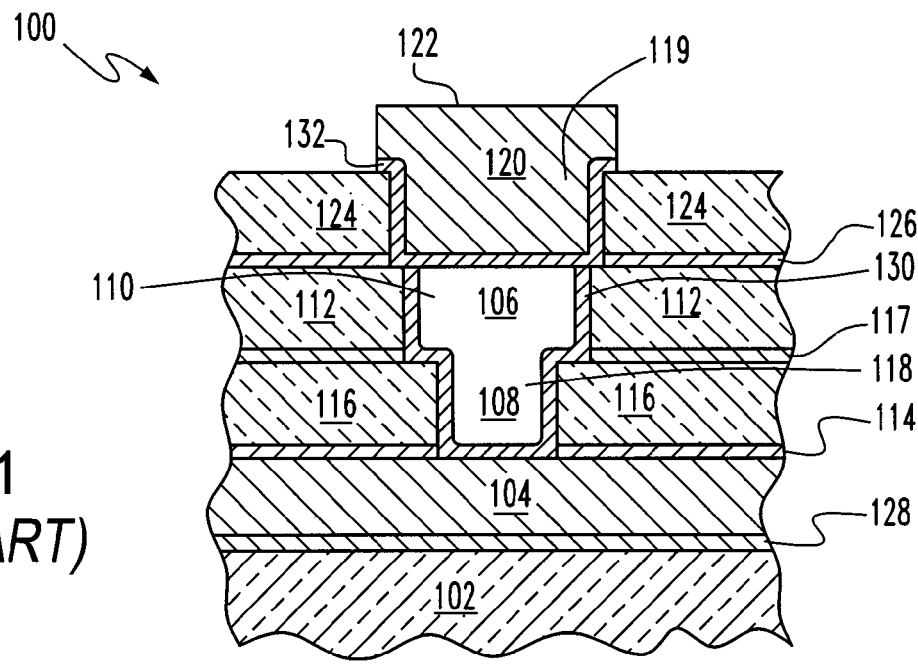
FIG. 1 shows a prior art structure.
FIG. 2 shows an apparatus for depositing liner films.

Referring now to FIG. 1 (PRIOR ART taken from U.S. Pat. No. 6,117,769), there is shown is a prior art cross-section of a semiconductor wafer 100 with a pair of aligned semiconductor channels of a conductive material, such as copper, disposed over a silicon substrate 102. A first channel 104 is shown, extending left-right and disposed below a second channel 106, which extends substantially perpendicular to the first channel 104. Similarly, a via 108 connects the first and second channels 104 and 106, which is a part of the second channel 106. The first channel 104 comprises a first conductive material. The second channel 106 is formed by filling a second channel opening 110 disposed in a second channel oxide layer (interlevel or interlayer dielectric) 112 with a second conductive material.

The first and second channels 104 and 106 are in horizontal planes separated vertically by a first etch stop nitride layer 114, a via oxide layer 116, and a thin via nitride layer 117. The cylindrical via opening 118 forms the cylindrical via 108 when it is filled with the second conductive material.

A wire bonding layer 120, typically an aluminum or aluminum-base alloy, is the uppermost conductive layer and is shown disposed over the second channel 106. The wire bonding layer 120 comprises aluminum or aluminum-base alloys.

The second channel 106 and the wire bonding layer 120 are in horizontal planes separated vertically by a second etch stop nitride layer 126 and an oxide layer 124.

Also shown disposed around the first channel 104 is barrier material 128, around the second channel 106 and the cylindrical via 108 is barrier material 130, and around the wire bonding layer 120 is barrier material 132. Barrier materials, where necessary, are used to prevent electromigration or diffusion of the conductive materials into the adjacent areas of the semiconductor. Tantalum nitride is the most commonly used barrier material for copper channels. Accordingly, barrier material 128 and 130 would be tantalum nitride. In the prior art, since the wire bonding layer comprises aluminum or aluminum-based alloys, the barrier material would be titanium nitride since conventional tantalum nitride is not a suitable barrier material for aluminum or aluminum-based alloys.

Referring now to FIG. 2 (PRIOR ART—also taken from U.S. Pat. No. 6,117,769), there is shown a physical vapor deposition chamber 200. Chamber 200 can be used to deposit or sputter metal films, such as conductive barrier materials, onto the surface of a silicon substrate 202. Substrate 202 is placed over a substrate holder 204 and is positioned face-up in the chamber 200. A target 206 is shown positioned face-down within the chamber 200. The target 206 is made of the material that is to be deposited onto the silicon substrate 202. A shield 208 is positioned within the interior of the chamber 200 to prevent target material from being deposited on the interior walls 209 of the chamber 200. Chamber 200 also includes inlets (not shown) for receiving gases such as argon and nitrogen that are to be used during the deposition of metal films. A direct current (DC) voltage source 210 is coupled between the target 206 (cathode), and the shields 208 (anode) for generating a plasma using argon gas. By applying a negative voltage to the target 206, the ions in the plasma will be attracted to the target 206 as the plasma is formed. As the plasma ions strike the target 206, particles are sputtered from the surface of the target 206 at a significant kinetic energy. The sputtered particles from target 206 are then deposited onto the silicon substrate 202 in the form of a thin metal film.

Chamber 200 can be used to conduct reactive sputtering using more than one element to make up the deposition material. In a reactive sputtering process, nitrogen gas would be introduced into the chamber 200 during the deposition. As a result, the sputter surface of the target 206 is nitrided; i.e. nitrogen reacts with the surface material to form a compound containing nitrogen. For example, when TaN is to be deposited onto the silicon substrate 202, the target 206 would be formed of tantalum. The nitrogen gas causes tantalum nitride to be deposited. Similarly, when TaSiN is to be deposited onto the silicon substrate 202, the target 206 would be formed of tantalum silicon. The nitrogen gas then causes tantalum silicon nitride to be deposited. The nitrided compound, e.g., TaN or TaSiN, would be deposited onto the silicon substrate 202 during the physical vapor deposition process.

In the prior art work quoted above, the liner layer is formed with a nitrogen-to-tantalum ratio of less than 1.0, with an atomic concentration of nitrogen at about 45-48%. Unlike the conventional tantalum nitride, the materials formed according to the cited prior art contain a nitrogen-to-tantalum ratio of 1.0 to 1.2. The tantalum nitride material formed is substantially impervious to the diffusion of aluminum atoms into the second copper channel 106 and the diffusion of copper atoms to aluminum bonding pads at the top of the structure (FIG. 1). Unlike the conventional tantalum nitride which comprises a nitrogen content by atomic weight of about 20%, the material formed according to the cited prior art contains a nitrogen content by atomic weight of more than about 30% and less than about 40%. The tantalum nitride material formed is substantially impervious to the diffusion of aluminum atoms therethrough into the second copper channel 106 and the diffusion of copper atoms therethrough into aluminum bonding pads at the top of the structure.

In production, according to the cited art, a conventional first damascene process was used to put down over a production semiconductor wafer a first channel 104 in a first channel oxide layer (not shown) above portions of a semiconductor device which is formed over a silicon substrate 102. The damascene process is a photolithographic process which uses a mask to define a first channel opening (not shown) in the first channel oxide layer to run in a first direction (which is horizontal in FIG. 1). The first channel opening is then filled with a first conductive material, such as copper, to form the first channel 104 using a conventional metal deposition technique, such as physical vapor deposition, chemical vapor deposition, electroplating, or a combination thereof. The polish stop nitride layer 114, the via oxide layer 116, and the via nitride layer 117 would be successively deposited on top of the first channel 104 and the first channel oxide layer using a conventional deposition technique.

By using the via photoresist and the via photolithographic process followed by nitride etching of a round via opening 118 in the via nitride layer 117, the basis for the cylindrical via 108 was formed. The subsequent deposition of the second channel oxide layer 112 prepared the way for the second channel 106 to be perpendicular to the first channel 104. The second damascene process is a photolithographic process which uses a mask to define the second channel opening 110 in the second channel oxide layer 112. Since the second damascene process uses an anisotropic oxide etch, the etch also forms the cylindrical via opening 118 down to the stop nitride layer 114. The anisotropic oxide etch etches faster in the vertical direction of FIG. 1 than in the horizontal direction. The nitride etch of the stop nitride layer 114 completes the etching steps. The deposition of the barrier material 130, such as a conventional TaN and the second conductive material, such as copper, into second channel opening 110 and via opening 118 forms the second channel 106 and the cylindrical via 108. The barrier material 130 is deposited using conventional deposition techniques, such as physical vapor deposition, chemical vapor deposition, atomic layer deposition or a combination thereof. Similarly, the second conductive material is deposited using a conventional metal deposition technique, such as physical vapor deposition, chemical vapor deposition, electroplating, or a combination thereof. Thereafter, a chemical mechanical polishing process is used to complete the conventional connection process.

Thereafter, a second stop nitride layer 126 and the wire bonding oxide layer 124 would be successively deposited over the second channel 106 and the second channel oxide layer 112 using conventional deposition techniques. By using a conventional photolithographic and etching process, a bonding pad opening 119 would be formed in the wire bonding oxide layer 124 and over second channel 106.

Next, the barrier material 132 is deposited over the sidewalls and the bottom of the bonding pad opening 119 in accordance with the prior art process. Chamber 200 would be pumped down to a vacuum in the milli-Torr (mTorr) range after the semiconductor wafer 202 has been positioned over the substrate support 204. Argon and nitrogen gases are then introduced into the chamber 200. A high DC voltage is applied across the target 206 and the shield 208 using DC voltage source 210 to generate a plasma. The nitrogen converts the surface of target 206 into a nitrided compound so that reactive sputtering can take place which results in the deposition of a layer of $TaN_2$ or a combination of $TaN_2$ and TaN over the sidewalls and the bottom of the opening 119. In the preferred mode of the cited prior art, the flow rate of the nitrogen gas would be within the range of about 28 to about 40 sccm (standard cubic centimeters), while the flow rate of the argon gas would be about 45 sccm. The deposition pressure would be within the range of about 5 mTorr to about 20 mTorr. The DC power supplied by the DC voltage source 210 would be within the range of about 0.5 kW to about 4 kW.

To deposit $TaN_2$ or the combination of $TaN_2$ and TaN, the prior art maintains a high nitrogen flow rate relative to the argon flow rate. Specifically, $TaN_2$ or the combination of $TaN_2$ and TaN will be formed when the ratio of the nitrogen flow rate and the argon flow rate is within the range of about 28/45 to about 40/45. Further, the DC power was not more than about 4 kW because higher DC power tends to reduce the amount of nitrogen incorporation into the resulting tantalum nitride material, making it unsuitable to act as a conductive barrier.

Figure 3:
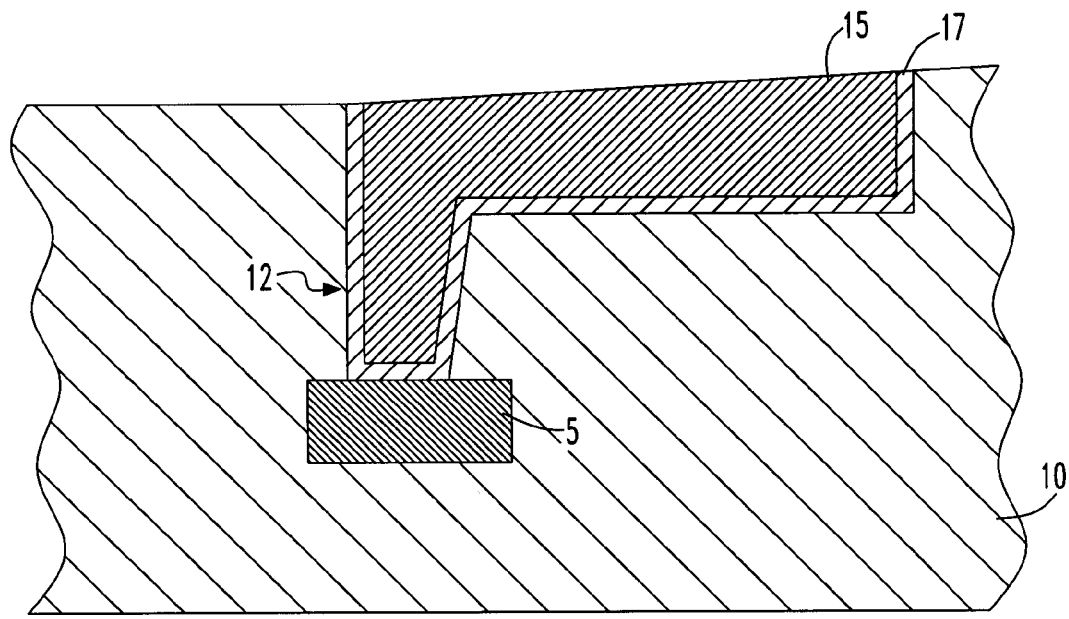
FIG. 3 illustrates in cross section a portion of a dual-damascene structure according to the invention.

Referring now to FIG. 3, there is shown a cross section of an interconnect structure according to the invention.

Layer 10 represents a dielectric layer, which may be any of the several layers in the back end. Box 5 represents schematically a lower layer of interconnect extending perpendicular to the paper.

Liner layer 17 fills a dual-damascene aperture that will contain the upper interconnect structure, comprising a via 12 extending down to make contact with box 5. Conductive material 15, illustratively copper, has been deposited to fill the aperture. A conventional chemical-mechanical polishing step has cleaned up the top surface of layer 10.

Those skilled in the art will appreciate that the process is repeated as required to generate the interconnect structure which, in advanced circuits, may have eight or more levels.

The present invention is directed at advanced interconnect structures, in which there is a problem in scaling the dimensions. As the interconnect structures are scaled to smaller ground rules, the resistance of a given path increases. Since liners have considerably greater resistivity than copper, it is important to keep the volume of the interconnect that is occupied by the liner small. A figure of 10% of the volume is considered to be acceptable in contemporary practice.

The diffusion barrier has three requirements. First, it must be a hermetic, pin-hole free, stable film that chemically separates Cu and the surrounding materials it touches. Second, it must have adequate electrical conductivity (contact resistance) to allow current flow from the underlying circuit element through the barrier film and through the via and line. The electrical resistance of the liner film on the sidewalls of the via and trench is unimportant. It is only the through-resistance of the liner at the bottom of the via that is electrically in series for this circuit. Third, the liner must not occupy too large a fraction of the volume of the via and line. Virtually any material for the liner will have much higher electrical resistance than the Cu used to form the via and line. Therefore, the liner material will not contribute to any extent to the conductivity of the line. However, the volume occupied by the liner displaces an equal volume of the high-conductivity Cu material and therefore leads to a higher net resistance, since there is less Cu in the final structure. An appropriate guideline for the allowable displacement volume of the liner material is 10% or less of the volume of the Cu circuit element.

As practiced in current production, the minimum dimensions of the Cu circuit elements are on the order of 90-130 nm. Future dimensions will reduce these minimum dimensions to 65, 45 and 33 nm or below.

The TaN liner thickness currently used in the 90-130 nm generation is approximately 6 nm. A second liner layer of pure Ta is also used in addition to the TaN to provide a better interface to the Cu material which results in better circuit reliability. The net film is on the order of 10 nm, which satisfies the 10% guideline. The currently used TaN has an electrical conductivity of approximately 300 to 400 micro- Ohm-cm, and the chemical composition of the TaN is 52-50% Ta and 48-50% N by atomic weight.

Those skilled in the art will appreciate that the properties of the currently used TaN diffusion barrier material will not be adequate for future generations of technology, based on the criteria above.

Figure 4:
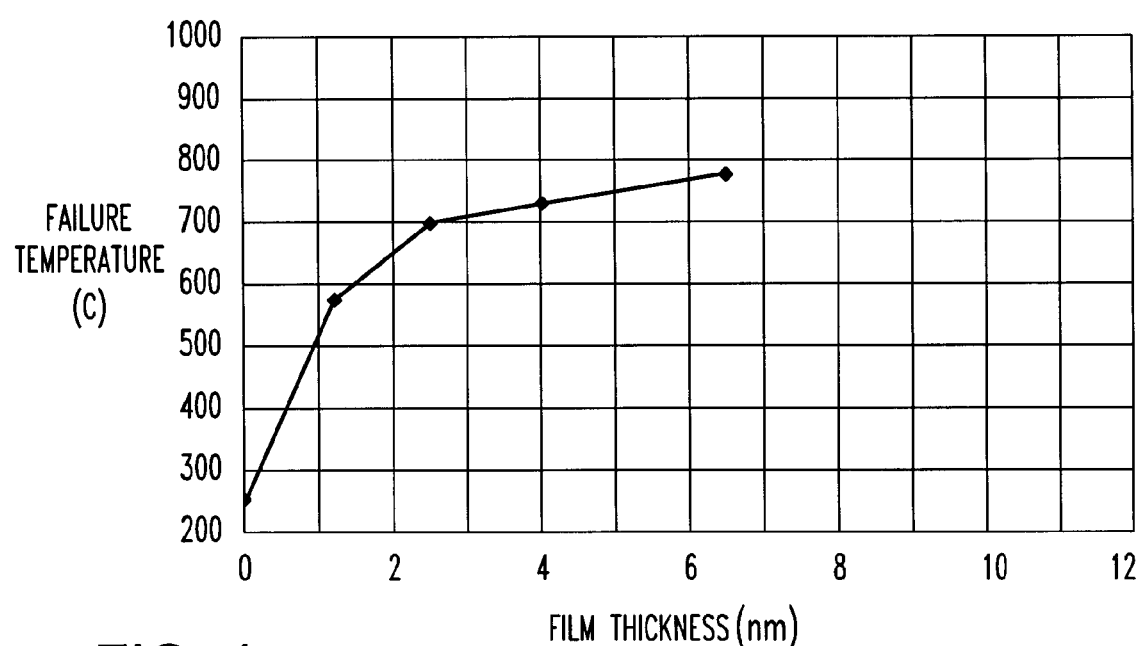
FIG. 4 shows the dependence of failure temperature on film thickness for prior art films.

As the thickness of the TaN is reduced as the dimensions scale down to maintain the 10% volume guideline, the liner becomes less effective at isolating the Cu from the environment. An example of this is shown in FIG. 4, where TaN is used to separate Cu from Si. This is an example of the role of a diffusion barrier in separating Cu from other materials. In this case, if the TaN fails as a barrier, either the Cu will move past it into the Si or else the Si will move through the barrier into the Cu. In either case, the electrical resistivity of the Cu film will change radically at the failure temperature. This has been measured as a function of film thickness. As the film thickness is reduced, the failure temperature also declines. A general guideline for this system, based on the temperature to which the circuit is exposed during its lifetime, is a minimum temperature of 730 C, which, as can be seen in the curve, requires a TaN thickness of TaN (for currently used compositions) of at least 4-5 nm. This thickness is acceptable in the 90-130 nm interconnect generations, but will be much too thick (i.e. greater than the 10% rule) for the 45 nm and smaller generations.

Unfortunately, as those skilled in the art are aware, the effectiveness of liner layers as diffusion barriers is reduced as they become thinner.

Thus, the liner layers of the current practice and/or the cited reference are not adequate for smaller groundrules of 65 nm, 45 nm and 33 nm that are contemplated by technical roadmaps.

It has been found that a liner layer having high resistivity, considerably above the conventional present resistivity value of 300-400 micro-Ohm-cm of contemporary practice, still produces an acceptable structure because it makes possible a much thinner (10× thinner than contemporary practice) layer that more than compensates for the higher resistivity.

We have found that the failure temperature for a constant thickness TaN film (using as an example a thickness of 2.5 nm) is a strong function of the level of nitrogen used in the production of the TaN and subsequently the level of N in the film.

Figure 5:
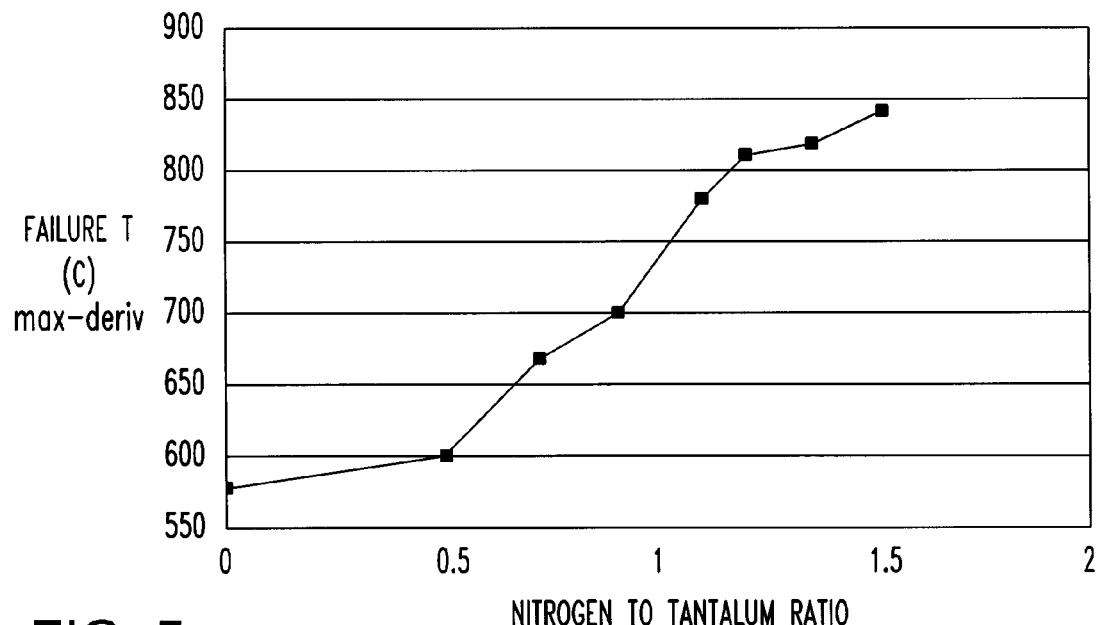
FIG. 5 shows the dependence of breakdown temperature on N:Ta ratio for films of 2.5 nm thickness.

FIG. 5 plots the diffusion barrier failure temperature for a 2.5 nm TaN film located between a Cu and a Si layer as a function of the nitrogen to tantalum ratio in the TaN film. As can be seen, a Ta—N ratio of 1:1, consistent with the previously used TaN process, would fail at a temperature of 700 C, well below the acceptable point of 730 C. Those skilled in the art will appreciate that, for the illustrative thickness, there is a plateau in the curve at temperatures above 800 C, for N:Ta ratios above 1.3.

Figure 6:
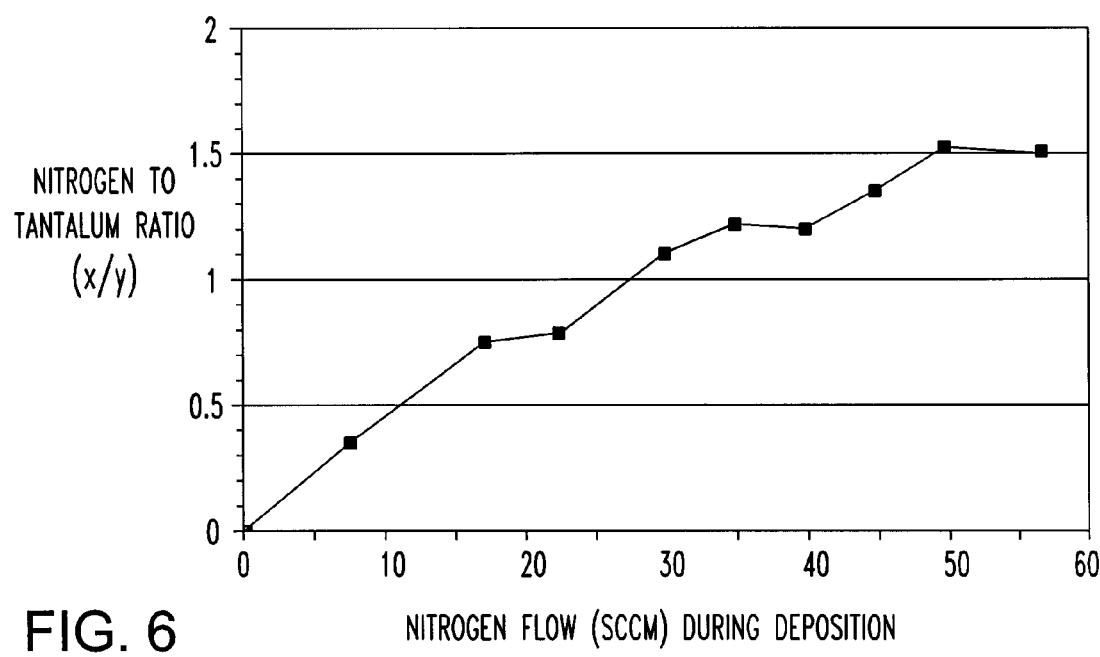
FIG. 6 shows stoichiometry as a function of nitrogen flow rate.

Those skilled in the art are aware that the nitrogen content of the film may be varied by altering the flow of N gas during the sputter deposition process that is normally used. Normally, the TaN is deposited by sputtering a Ta target (cathode) in an ambient that is a combination of N and an AR carrier gas. FIG. 6 illustrates the stoichiometry of films as a function of N flow rate, showing a steady progression of N content in the final film. Advantageously, the final composition is not a sensitive function of gas flow rate in the stoichiometry range of 1-1.5, so that the process window is relatively broad in that range.

Figure 7:
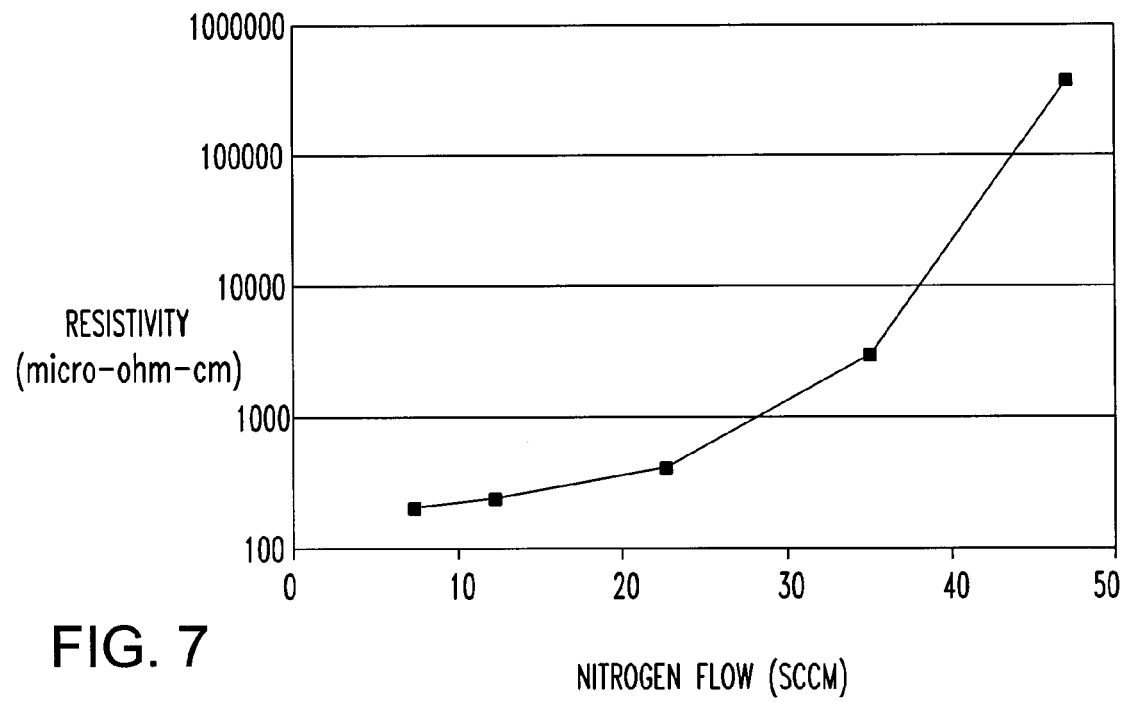
FIG. 7 shows the resistivity of films as a function of N flow rate.

FIG. 7 illustrates the electrical resistivity of the films as a function of nitrogen flow rate at constant magnetron power of 1 kw in the physical deposition chamber.

In the range above 30 sccm that produces a N:Ta ratio above the prior art ratio of 1:1, the resistivity is greater than 1000 micro-Ohm-cm, three times the value used in the prior art.

Thus, those skilled in the art would not have thought to increase the N:Ta ratio because it was known that that would increase the resistivity Higher resistivity, as explained above, is detrimental because it increases the in-line resistance of the interconnect-via combination and therefore detrimentally affects circuit operation, aggravating the detrimental effect of decreasing via dimensions. Further, the curve in FIG. 7 rises more steeply as the flow rate increases, so that one skilled in the art would be discouraged from increasing the flow rate by the sharp increase in the detrimental resistivity.

The present invention uses films with a high level of nitrogen. Referring to FIG. 5, it can be seen that the diffusion barrier failure temperature (for a film of 2.5 nm thickness) at a ratio of 1.2 and above is significantly higher than the required temperature of 730 C. It is therefore possible to reduce the film thickness even below 2.5 nm.

Figure 8:
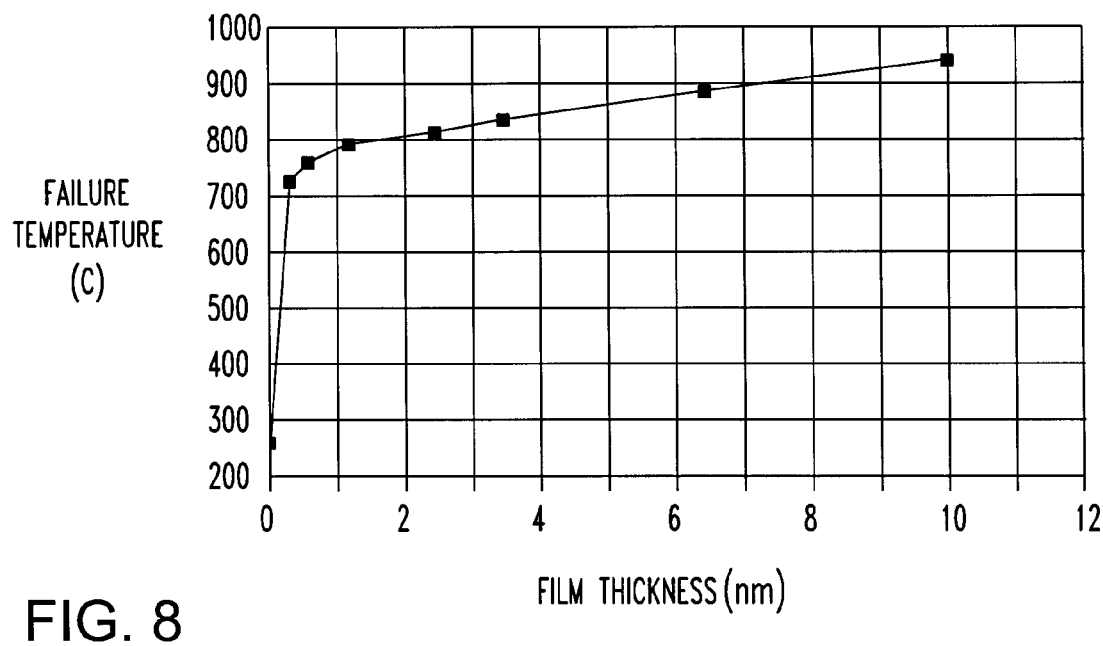
FIG. 8 shows the dependence of breakdown temperature as a function of film thickness.

FIG. 8 shows the failure temperature for $TaN_x$, where x is >1.2, showing the unexpected result that the failure temperature is acceptable for a film thickness as low as 0.4 nm (4 Angstroms).

The film is preferably formed in a physical vapor deposition tool such as an Endura tool from Applied Materials having an $Ar:N_2$ gas flow in the range of 1:2 and a wafer temperature in the range of 25 to 400 C.

Thus, the acceptable film thickness has been reduced by a factor of ten. Using the criteria set forth above, we can conclude that films made according to the invention can be used down to the 32 nm ground rule generation.

The reduction in the critical diffusion barrier thickness is also consistent with the criterion that the net resistance of the liner film at the via bottom remain small. In the current manufacturing situation, a liner film with a resistivity of 500 micro-Ohm-cm and a thickness of 6 nm has a net resistivity of 0.03 Ohms/square micron.

A film according to the invention, with a resistivity of 3000 micro-ohm-cm and a thickness of 0.5 nm has a net resistance of 0.015 ohms/square micron. Thus, in spite of the resistivity being greater by a factor of nearly ten, the net resistance is a factor of two less than a film according to the current practice.

Those skilled in the art will appreciate that the present invention is not restricted to a damascene structure, nor is it limited to use as a barrier to Cu diffusion, but may be used with other structures and materials. The dielectric surrounding the conductor may be oxide, nitride, low-k materials such as SiLK™ or other materials.

While the invention has been described in terms of a single preferred embodiment, those skilled in the art will recognize that the invention can be practiced in various versions within the spirit and scope of the following claims.

What is claimed is:

1. A method of forming an interconnect structure in an integrated circuit comprising a layer of a conductive material embedded in an interlevel dielectric, the conductive material being separated from the dielectric by at least one liner layer, comprising the steps of introducing Ta and N into a chamber containing an integrated circuit having an aperture formed in a layer of interlevel dielectric, thereby depositing said liner layer in said aperture, and thereafter depositing a layer of conductive material in said aperture and in which said at least one liner layer is formed from a material comprising $TaN_x$, where x is greater than 1.2 and less than 1.5 and said at least one liner layer having a substantially uniform chemical composition and a failure temperature of greater than 730 degrees Centigrade.

2. The method of forming an interconnect structure according to claim 1, in which said liner layer is deposited with a thickness less than 4nm.

3. The method of forming an interconnect structure according to claim 1, in which said liner layer is deposited with a thickness less than 0.75 nm.

4. The method of forming an interconnect structure according to claim 1, in which said liner layer is deposited with a thickness less than 0.5nm.

5. The method of forming an interconnect structure according to claim 1, in which said liner layer has a resistivity greater than 1000 micro-Ohm-cm.

6. The method of forming an interconnect structure according to claim 2, in which said liner layer has a resistivity greater than 1000 micro-Ohm-cm.

7. The method of forming an interconnect structure according to claim 3, in which said liner layer has a resistivity greater than 1000 micro-Ohm-cm.

8. The method of forming an interconnect structure according to claim 4, in which said liner layer has a resistivity greater than 1000 micro-Ohm-cm.

9. A method of forming an interconnect structure in an integrated circuit comprising a layer of a conductive material embedded in an interlevel dielectric, the conductive material being separated from the dielectric by at least one liner layer, comprising the steps of introducing tantalum and nitrogen in an atomic concentration ratio less than 1.5:1 N:Ta to and greater than 1.2:1 N:Ta into a chamber containing an integrated circuit having an aperture formed in a layer of interlevel dielectric, thereby depositing said liner layer in said aperture, and thereafter depositing a layer of conductive material in said aperture and in which said at least one liner layer having a thickness of less than 4 nm, a substantially uniform chemical composition and a failure temperature greater than 730 degrees Centigrade.

10. The method of forming an interconnect structure according to claim 9, in which said liner layer has a resistivity greater than 1000 micro-Ohm-cm.

* * * * *